(12) United States Patent
Chen et al.

(10) Patent No.: US 9,042,193 B2
(45) Date of Patent: May 26, 2015

(54) SENSE AMPLIFIER SCHEME

(71) Applicant: Taiwan Semiconductor Manufacturing Company Limited, Hsinchu (TW)

(72) Inventors: Chien-Yuan Chen, Hsinchu (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 13/972,974

(22) Filed: Aug. 22, 2013

(65) Prior Publication Data

US 2015/0055426 A1 Feb. 26, 2015

(51) Int. Cl.
*G11C 7/02* (2006.01)
*G11C 7/06* (2006.01)
*G11C 11/419* (2006.01)

(52) U.S. Cl.
CPC .............. *G11C 7/062* (2013.01); *G11C 11/419* (2013.01)

(58) Field of Classification Search
CPC .......... G11C 7/06; G11C 7/00; G11C 11/419; G11C 7/12; G11C 11/414; G11C 11/415

USPC ............ 365/189.19, 190, 196, 202, 204, 218, 365/227, 230.03
See application file for complete search history.

(56) References Cited

U.S. PATENT DOCUMENTS

2005/0264322 A1* 12/2005 Nakazato et al. ............... 327/51

\* cited by examiner

*Primary Examiner* — Thong Q Le
(74) *Attorney, Agent, or Firm* — Jones Day

(57) ABSTRACT

A sense amplifier circuit comprising a pair of cross-coupled inverters and a data line charging circuit is disclosed. The cross-coupled inverters comprise a first inverter and a second inverter. The first inverter has a first pull-up transistor with a first pull-up terminal. The second inverter has a second pull-up transistor with a second pull-up terminal. The output of the first inverter is coupled to the input of the second inverter at a first sense amp node. The output of the second inverter is coupled to the input of the first inverter at a second sense amp node. The data line charging circuit has a first node connected to a data line and the first pull-up terminal. The data line charging circuit also has a second node connected to a complementary data line and the second pull-up terminal. The first and second pull-up transistors are coupled to different voltage levels when a sense amplifier enable signal is activated.

17 Claims, 7 Drawing Sheets

SENSE AMPLIFIER SCHEME

FIELD

The technology described in this patent document relates to a sense amplifier for reading data.

BACKGROUND

Static random access memory (SRAM) is commonly used in electronic devices. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a data line (or a pair of data lines), which is used for storing a data bit into a selected SRAM cell or reading a stored data bit from the selected SRAM cell. Sense amplifier circuits are connected to data lines and are used for sensing the value of a stored data bit read from a selected SRAM cell.

SUMMARY

In accordance with the teachings described herein, circuits and methods are provided for a sense amplifier circuit. In one example, provided is a sense amplifier circuit comprising a pair of cross-coupled inverters and a data line charging circuit. The cross-coupled inverters comprise a first inverter and a second inverter. The first inverter has a first pull-up transistor with a first pull-up terminal. The second inverter has a second pull-up transistor with a second pull-up terminal. The output of the first inverter is coupled to the input of the second inverter at a first sense amp node. The output of the second inverter is coupled to the input of the first inverter at a second sense amp node. The data line charging circuit has a first node connected to a data line and the first pull-up terminal. The data line charging circuit also has a second node connected to a complementary data line and the second pull-up terminal. The first and second pull-up transistors are coupled to different voltage levels when a sense amplifier enable signal is activated.

In another example, provided is a sense amplifier circuit comprising a first PMOS transistor having a first terminal connected to a first terminal of a first NMOS transistor at a first sense amp node. The first PMOS transistor also has a gate terminal connected to a gate terminal of the first NMOS transistor. The sense amplifier circuit further comprises a second PMOS transistor having a first terminal connected to a first terminal of a second NMOS transistor at a second sense amp node. The second PMOS transistor also has a gate terminal connected to a gate terminal of the second NMOS transistor. The gates of the first NMOS and PMOS transistors are coupled to the second sense amp node and the gates of the second NMOS and PMOS transistors are coupled to the first sense amp node. The sense amplifier circuit further comprises a data line charging circuit having a first node connected to a data line and a second terminal of the first PMOS transistor. The data line charging circuit also has a second node connected to a complementary data line and a second terminal of the second PMOS transistor. The first and second PMOS transistors have source terminals that are coupled to different voltage levels when a sense amplifier enable signal is activated.

In another example, a method is provided for sensing a value placed on a data line pair. The method comprises, in a pair of cross-coupled inverters made up of a first inverter and a second inverter, coupling a first pull-up terminal of a first pull-up transistor of the first inverter to a first voltage level and coupling a second pull-up terminal of a second pull-up transistor of the second inverter to a second voltage level. The method further comprises sensing using the pair of cross-coupled inverters whether the voltage level on the data line or the data line complement indicates a first logical value. The method additionally comprises setting a first sense amp node to a zero voltage level when the voltage level on the data line of the data line pair indicates the first logical value and setting a second sense amp node to a zero voltage level when the voltage level on the data line complement of the data line pair indicates the first logical value. In some embodiments of this example the method further comprises charging the data line to a supply voltage level when the voltage level on the data line indicates a second logical value and charging the data line complement to a supply voltage level when the voltage level on the data line complement indicates the second logical value.

DETAILED DESCRIPTION

Figure 1:
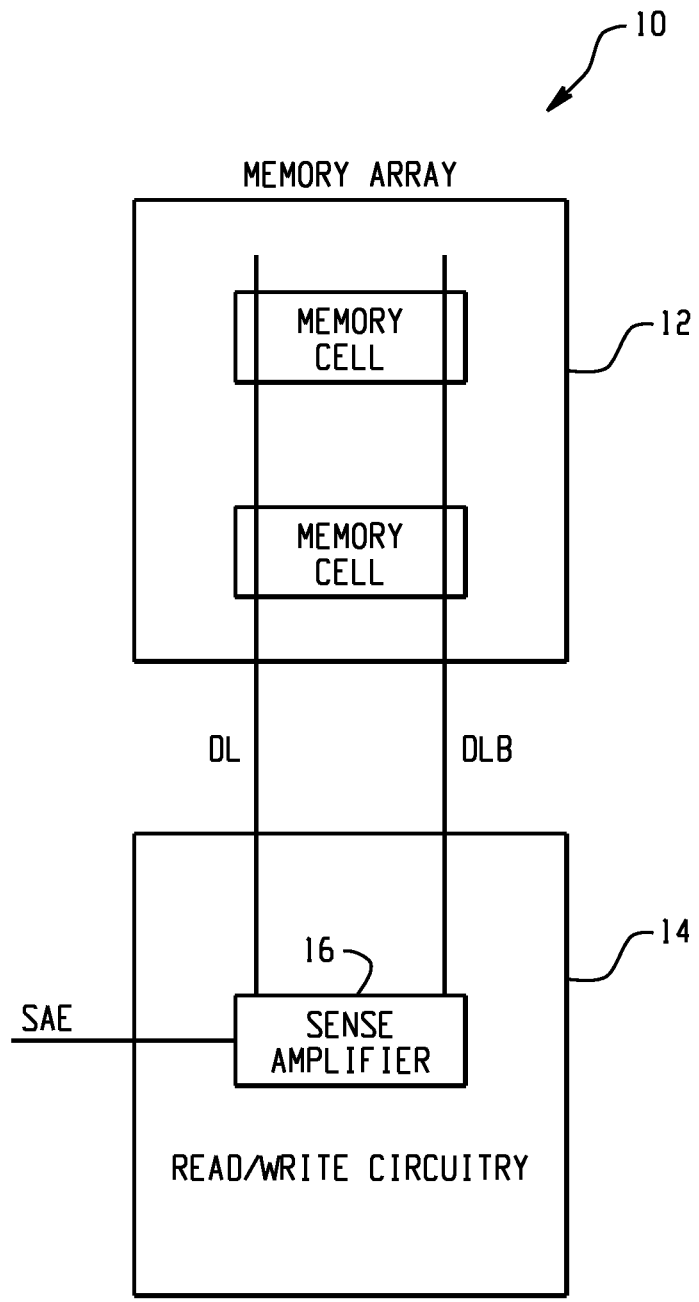
FIG. 1 is a block diagram depicting an example SRAM circuit.

Depicted in FIG. 1 is a block diagram of an example SRAM circuit 10. The SRAM circuit 10 includes an array of SRAM cells 12 coupled to read/write circuitry 14 through complementary data line pair DL and DLB. The read/write circuitry 14 comprises a sense amplifier 16. The sense amplifier 16 reads data from the array of SRAM cells 12 upon receipt of a sense amplifier enable (SAE) signal.

Figure 2:
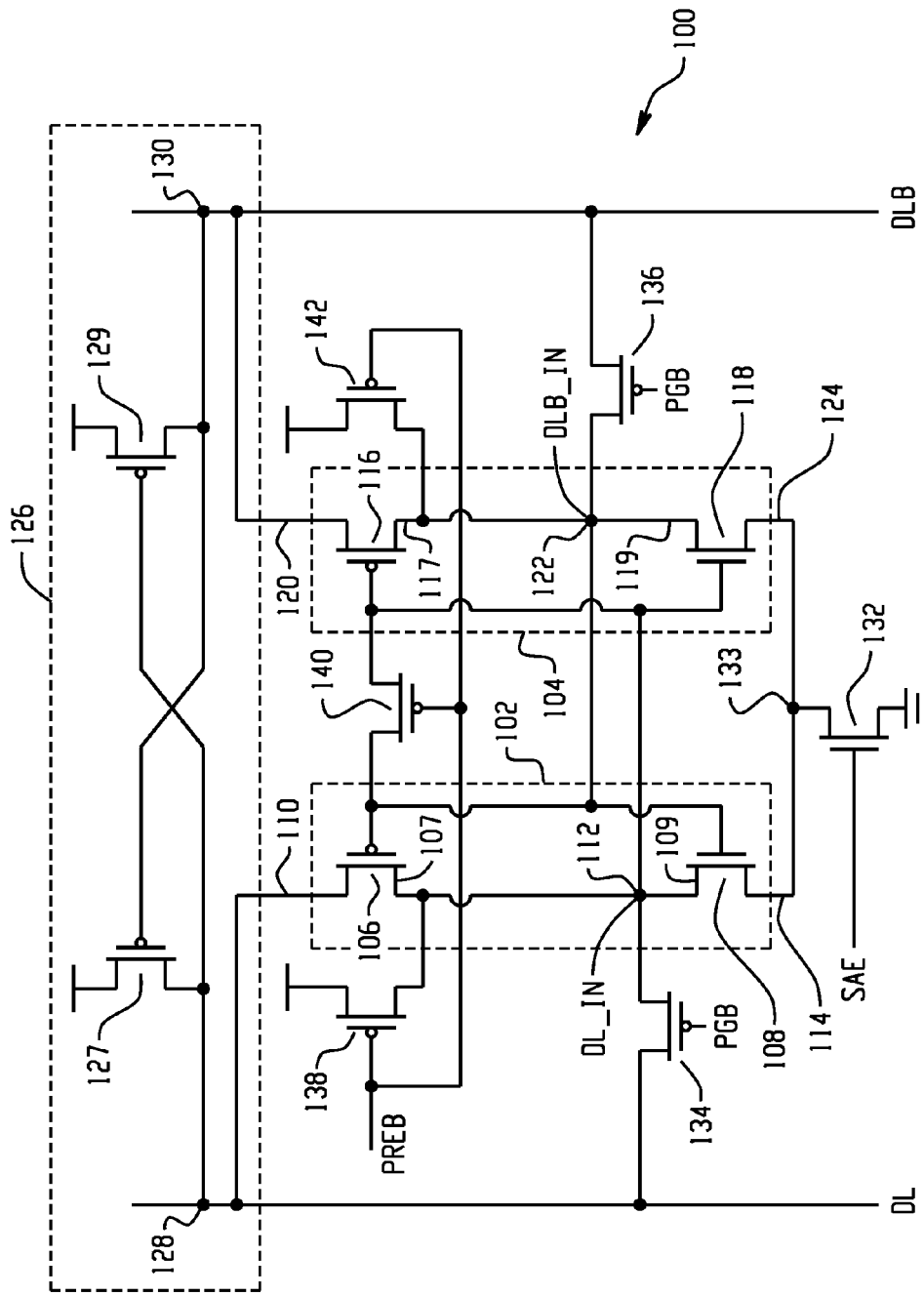
FIG. 2 is a schematic diagram of an example sense amplifier circuit.

Depicted in FIG. 2 is a schematic diagram of an example sense amplifier circuit 100. The sense amplifier circuit 100 comprises a pair of cross-coupled inverters 102, 104, a data line charging circuit 126, a sense amplifier enable circuit 132, a pair of data pass gates 134, 136, and pre-charge circuitry 138, 140, 142.

The pair of cross-coupled inverters comprises a first inverter 102 and a second inverter 104. The first inverter 102 comprises a pull-up transistor 106 (a PMOS transistor in this example) and a pull-down transistor 108 (an NMOS transistor in this example). The pull-up transistor 106 has a pull-up terminal 110, a second terminal 107 connected to a first sense amp node 112 (also labeled DL_IN), and a gate terminal connected to the gate terminal of the pull-down transistor 108. The pull-down transistor 108 also has a pull-down terminal 114 and a second terminal 109 connected to first sense amp node 112.

Similarly, the second inverter comprises a pull-up transistor 116 (a PMOS transistor in this example) and a pull-down transistor 118 (an NMOS transistor in this example). The pull-up transistor 116 has a pull-up terminal 120, a second terminal 117 connected to a second sense amp node 122 (also labeled DLB_IN), and a gate terminal connected to the gate terminal of the pull-down transistor 118. The pull-down transistor 118 also has a pull-down terminal 124 and a second terminal 119 connected to second sense amp node 122. The output of the first inverter 102 is coupled to the input of the second inverter 104 at the first sense amp node 112. The output of the second inverter 104 is coupled to the input of the first inverter 102 at the second sense amp node 122.

The data line charging circuit 126 has a DL node 128 that is connected to a data line DL and the first pull-up terminal 110. The data line charging circuit 126 also has a DLB node 130 that is connected to a complementary data line DLB and the second pull-up terminal 120. The data line charging circuit 126 in this example comprises cross-coupled PMOS transistors 127, 129 with the gate of each transistor coupled to the drain of the other transistor. The drain of PMOS transistor 127 is coupled to data line DL, and the gate of PMOS transistor 127 is coupled to the complementary data line DLB. Similarly, the drain of PMOS transistor 129 is coupled to complementary data line DLB, and the gate of PMOS transistor 129 is coupled to the data line DL.

The sense amplifier enable circuit 132 in this example comprises an NMOS pull-down transistor 132 having a terminal 133 for pulling the pull down terminals 114, 124 to ground when a SAE signal is active at a high voltage level.

The pair of data pass gates comprises a first pass gate 134 (a PMOS transistor in this example) that, when enabled, can couple the first sense amp node 112 to the data line DL and a second pass gate 136 (a PMOS transistor in this example) that, when enabled, can couple the second sense amp node 122 to the data line complement DLB.

The pre-charge circuitry 138, 140, 142 in this example comprises PMOS transistors 138, 140, 142 that can be enabled to charge the first sense amp node 112 and the second sense amp node 122 to the supply voltage level when a pre-charge complement (PREB) signal is activated. The pre-charge circuit comprises a first pull-up transistor 138 having a pull-up terminal coupled to the first sense amp node 112 and a second pull-up transistor 142 having a pull-up terminal coupled to the second sense amp node 122.

The sense amplifier circuit 100 is configured such that the pull-up terminals 110, 120 of the first and second pull-up transistors 106, 116 are coupled to different voltage levels (e.g., the DL and DLB voltage levels) when a sense amplifier enable (SAE) signal is activated. This causes the pair of inverters to operate at different voltage levels.

Figure 3:
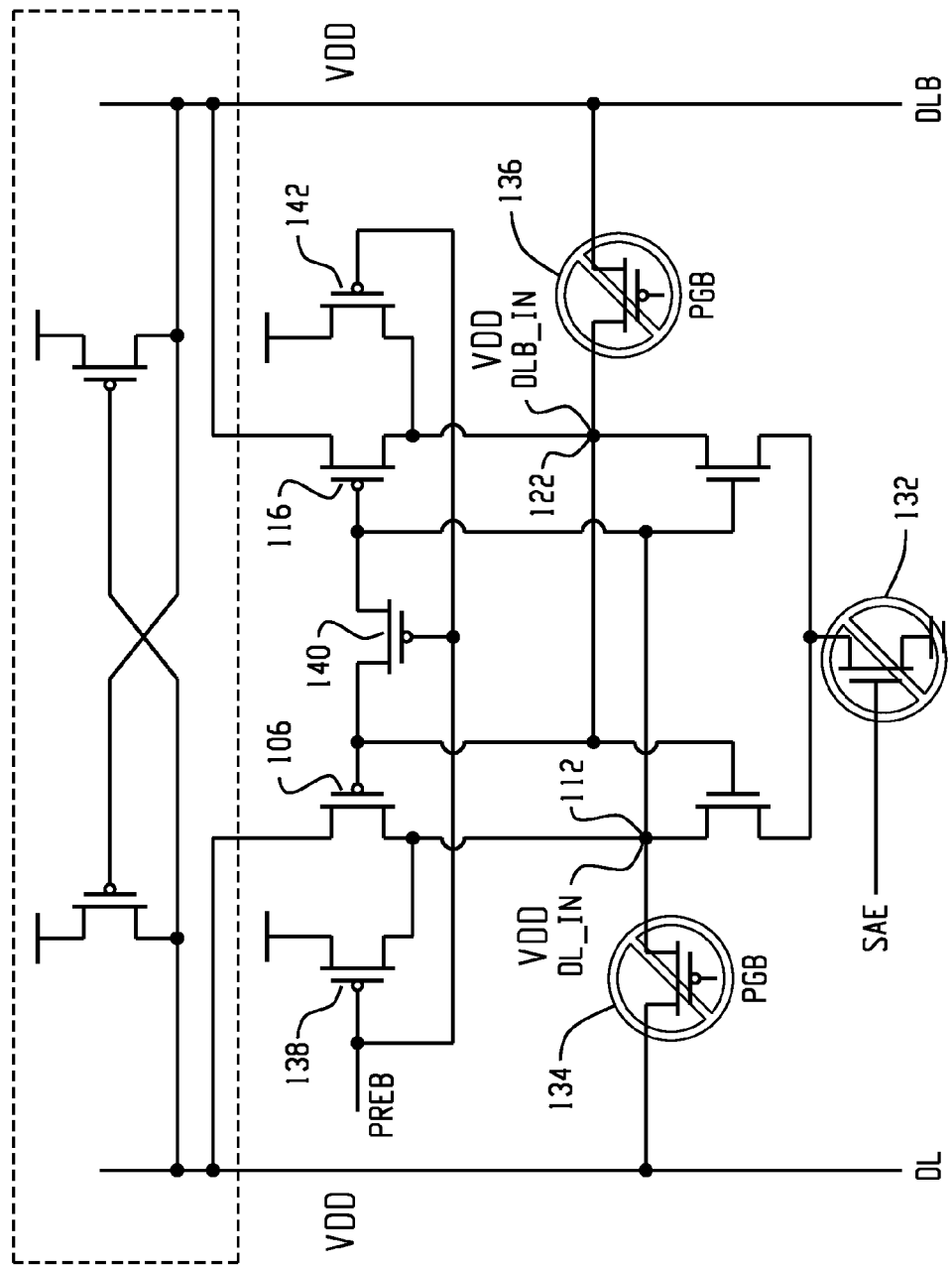
FIG. 3 is a schematic diagram of an example sense amplifier circuit that illustrates voltages and transistor states at an example state of operation.

In operation, at the beginning of a memory read operation, the data line DL and the data line complement DLB are pre-charged to a supply voltage level VDD as illustrated in FIG. 3. The pair of pass gates 134, 136 and the sense amplifier enable circuit 132 are disabled at this time. The first sense amp node 112 (DL_IN) and the second sense amp node 122 (DLB_IN) are both charged to the supply voltage level VDD through the operation of the pre-charge circuitry. In particular, in this example, PMOS transistors 138 and 142 are turned on by the PREB signal and, as a result of being turned on, pull up first sense amp node 112 and second sense amp node 122, respectively, to the supply voltage level VDD at the sources of corresponding PMOS transistors 138 and 142. The gates of PMOS transistors 106, 116 have a high value applied thereto since they are coupled to second sense amp node 122 and first sense amp node 112, respectively, thereby resulting in PMOS transistors 106, 116 being turned off. This results in first sense amp node 112 and second sense amp node 122 respectively being decoupled from data line DL and data line complement DLB. PMOS transistor 140 is also turned on by the PREB signal and, as a result of being turned on, (i) allows the high voltage level at first sense amp node 112 to also be applied to the gate of PMOS transistor 106, and (ii) allows the high voltage level at second sense amp node 122 to also be applied to the gate of PMOS transistor 116.

Figure 4:
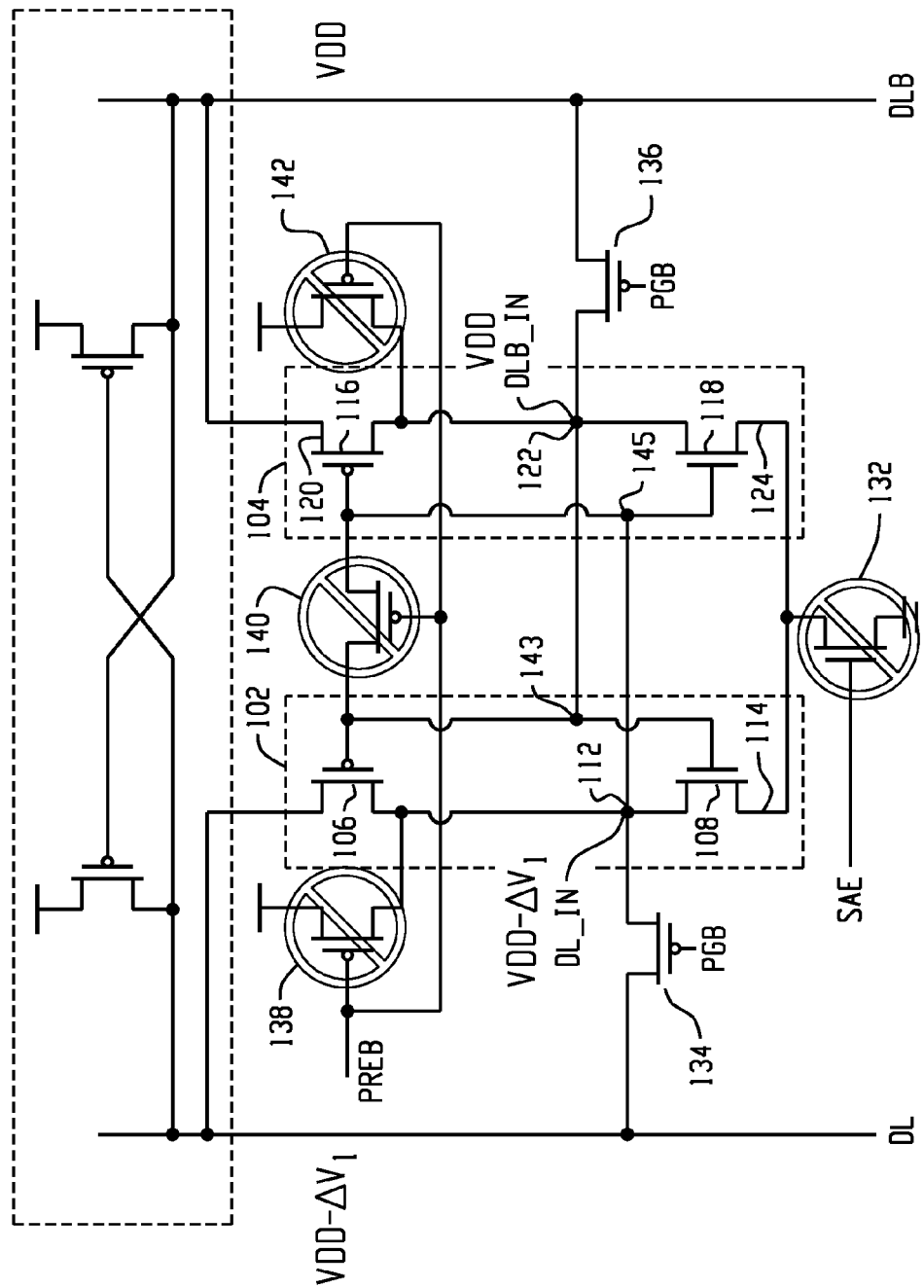
FIG. 4 is a schematic diagram of an example sense amplifier circuit that illustrates voltages and transistor states at another example state of operation.

After the pre-charge phase, the pre-charge circuitry 138, 140, 142 is disabled, the sense amp enable circuit 132 remains disabled and the pair of pass gates 134, 136 are enabled, as illustrated in FIG. 4. A memory cell (not shown) coupled to the data line DL and the data line complement DLB will attempt to pull down one of the data line DL and the data line complement DLB to indicate a zero data value on one of those lines. In the example shown, the data line DL is pulled down to a VDD-ΔV1 level by the memory cell. Because the memory cell in this example has a relatively small drive capability, it does not pull the data line all the way down to zero volts but pulls it down a ΔV1 voltage level below the supply voltage level VDD. Because the pass gates are turned on, the first sense amp node 112 is also pulled down to a VDD-ΔV1 level.

Figure 5:
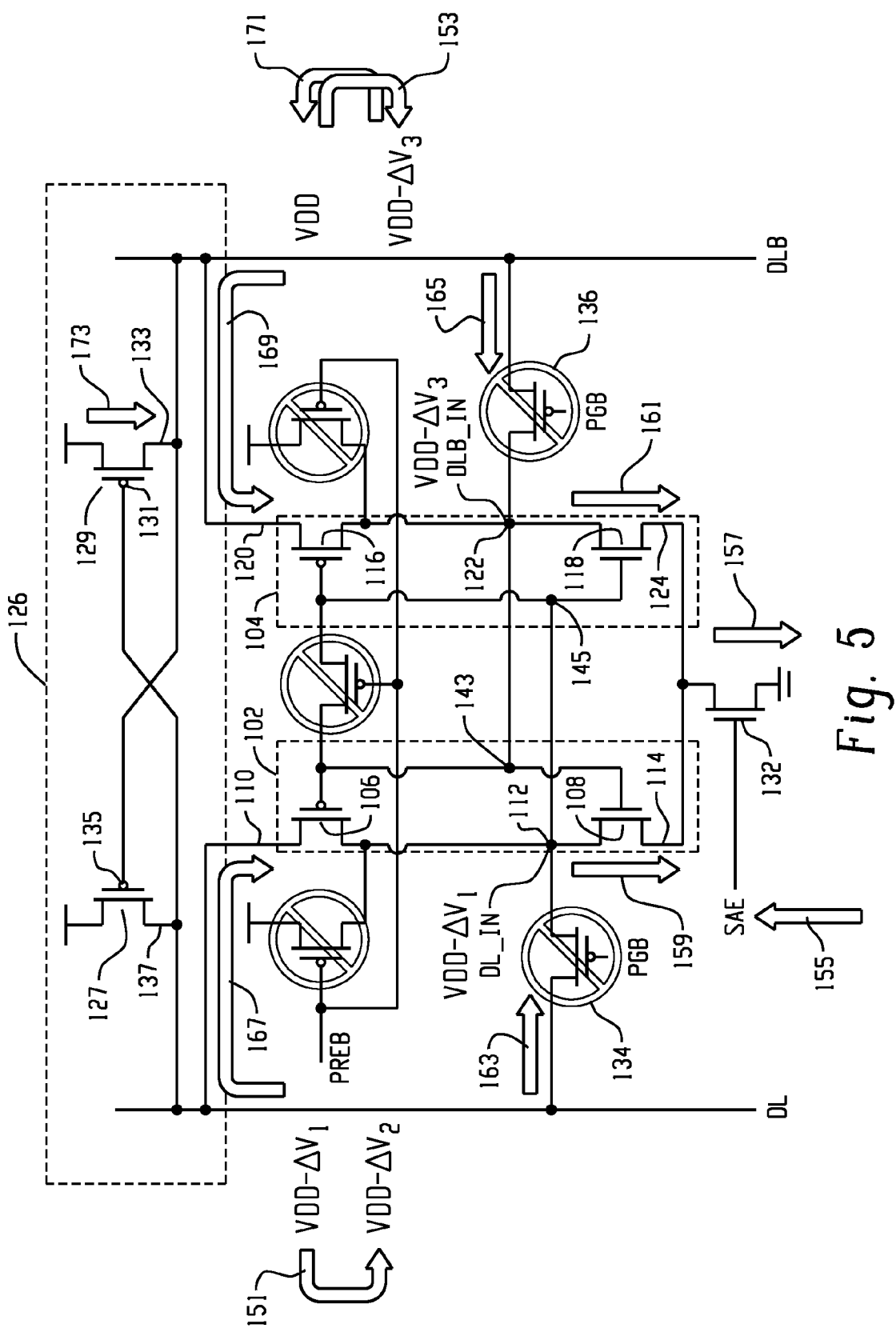
FIG. 5 is a schematic diagram of an example sense amplifier circuit that illustrates voltages and transistor states at yet another example state of operation.

The operation of the sense amp circuit will also cause the voltage level on both the data line DL and the data line complement DLB to further decrease to VDD-ΔV2 and VDD-ΔV3, respectively, as illustrated (by arrows 151, 153) in FIG. 5. The activation (illustrated by arrow 155) of the sense amp enable signal SAE will cause sense amp enable circuit 132 to turn on, which when turned on will pull down (illustrated by arrow 157) the voltage level at terminals 114, 124. The load of transistors 108, 118, in turn, pull down (illustrated by arrows 159, 161) first sense amp node 112 and second sense amp node 122 a certain amount to VDD-ΔV2 and VDD-ΔV3, respectively. In this example, ΔV2 will be greater in magnitude than ΔV3 since ΔV2 includes ΔV1. Shortly after the sense amp enable signal SAE becomes active, the PGB signal will deactivate and the pass gates 134, 136 will turn off thereby blocking (illustrated by arrow 163) the connection between the data line DL and the first sense amp node 112, and also blocking (illustrated by arrow 165) the connection between the data line complement DLB and the second sense amp node 122. Transistors 106, 116 will pull down (illustrated by arrows 167, 169) the data line DL and the data line complement DLB, respectively, to the level at the first sense amp node 112 and the second sense amp node 122, which are VDD-ΔV2 and VDD-ΔV3, respectively.

The cross-coupled inverters 102, 104 attempt to sense whether the data line DL or the data line complement DLB has a zero value. Because the pull up terminals 110, 120 of the two inverters 102, 104 are coupled to the corresponding data line DL and the data line complement DLB, the two inverters 102, 104 operate at different voltage levels. This helps the inverters to more quickly and accurately sense which of the data line DL and the data line complement DLB has a zero data value. In particular, terminal 110 of the first inverter 102 is at the voltage level on the data line DL and terminal 120 of the second inverter 104 is at the voltage level on the data line complement DLB. Also, the input 143 of the first inverter 102 is at the DLB_IN voltage level and the input 145 of the second inverter 104 is at the DL_IN voltage level. In this example, since the voltage level at the input 143 of first inverter 102 is higher than the voltage level at the input 145 of the second inverter 104 and the voltage at terminal 110 is lower than the voltage at terminal 120, the output 112 of the first inverter 102 will be driven to a zero output value before the output 122 of the second inverter 104 can be driven to a zero output value. Once the output 112 of the first inverter 102 is driven to a zero output value, the output 122 of the second inverter 104 will be driven to a high output value. This indicates a zero value for the data line DL and a one value for the data line complement DLB.

The cross-coupled PMOS transistors 127, 129 in the data line charging circuit 126 function to drive one the data line DL and the data line complement DLB to the full supply voltage level. In this example, the data line complement DLB is driven by (illustrated by arrow 171) the PMOS transistor 129 to a full supply voltage level at the source of PMOS transistor 129. Because the voltage on the gate 131 (i.e., the data line DL voltage level) of the PMOS transistor 129 is lower than the voltage on the drain 133 (i.e., the data line complement DLB voltage level) of the PMOS transistor 129, the PMOS transistor 129 turns on to drive (illustrated by arrow 173) the voltage level on the data line complement DLB to the full supply voltage level VDD at the source of PMOS transistor 129. In contrast, the voltage on the gate 135 (i.e., the data line complement DLB voltage level) of the PMOS transistor 127 is higher than the voltage on the drain 137 (i.e., the data line DL voltage level) of the PMOS transistor 127, and consequently the PMOS transistor 127 remains off.

Figure 6:
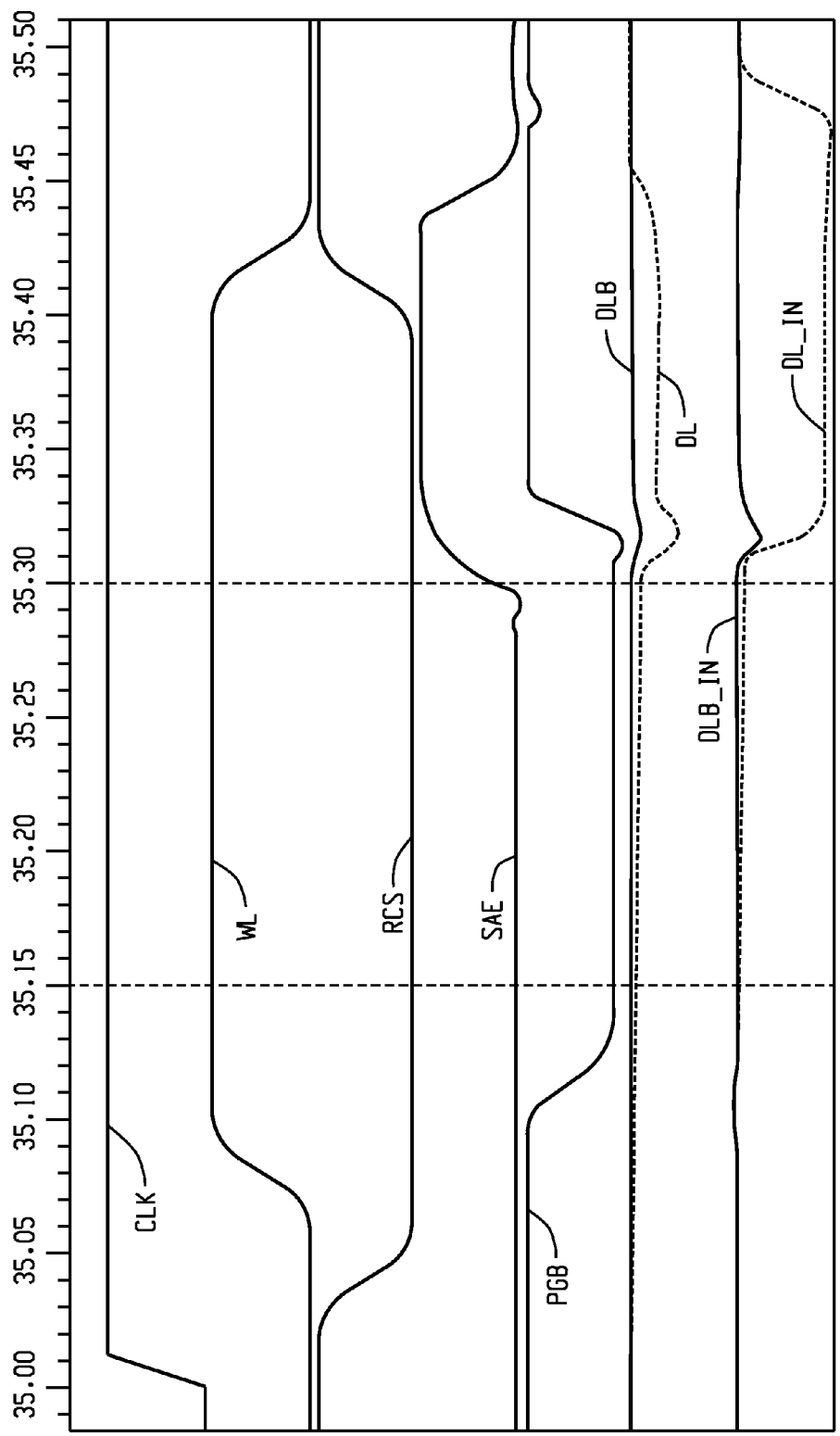
FIG. 6 is a chart of timing signals for the example sense amplifier circuit.

FIG. 6 is a chart of timing signals for the example sense amplifier circuit 100. The timing chart depicts curves of a word line signal (WL), row column select signal (RCS), sense amplifier enable signal (SAE), pass gate complement signal (PGB), data line DL and data line complement DLB voltage levels, and first sense amp node (DL_IN) voltage level and second sense amp node (DLB_IN) voltage level, and the timing relationship between them with a read operation and a zero value on the data line DL. In particular, during a read cycle at a time T1, the CLK and WL signals are at an active high level and the RCS and PGB signals are at an active low level. After this milestone the data line DL begins to be pulled down by a memory cell to a VDD-ΔV1 level and the DL_IN node begins to mirror the DL because the pass gates 134, 136 (depicted in FIG. 2) are enabled by the PGB signal. At a time T2, the SAE signal begins to transition to an active high state and shortly thereafter the PGB signal transitions to an inactive low state thereby turning off the pass gates 134, 136 (depicted in FIG. 5). The data line DL is pulled down to a VDD-ΔV2 level and the data line complement DLB is pulled down to a VDD-ΔV3 level. The DL_IN node 112 is driven by the first inverter 102 to a zero value before the DLB node 122 is driven by the second inverter 104 can be driven to a zero output value. After the DL_IN node 112 is driven to a zero output value, the DLB node 122 is driven to a high output value. This indicates a zero value for the data line DL and a one value for the data line complement DLB.

Figure 7:
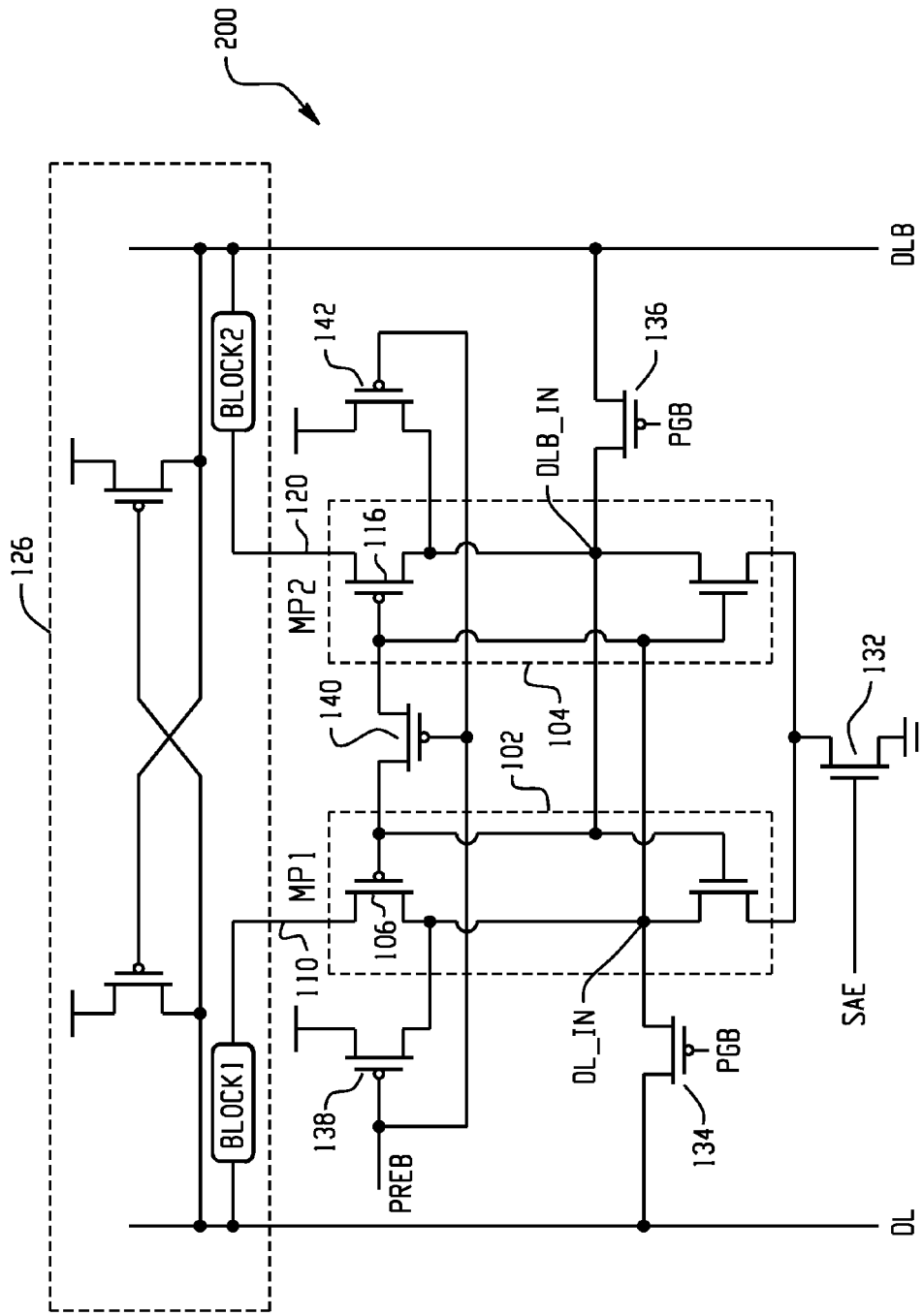
FIG. 7 is a schematic diagram of another example sense amplifier circuit.

Depicted in FIG. 7 is a schematic diagram of an example sense amplifier circuit 200. The sense amplifier circuit 200 comprises a pair of cross-coupled inverters 102, 104, a data line charging circuit 126, a sense amplifier enable circuit 132, a pair of data pass gates 134, 136, and pre-charge circuitry 138, 140, 142. The sense amplifier circuit 200 differs from that of FIG. 2 in that circuitry in block 1 and block 2 can be used to selectively couple the pull-up transistors 106, 116 to the data line DL and the data line complement DLB. Instead of a permanent connection of pull-up terminals 110, 120 to the data line DL and the data line complement DLB, circuits can be included that allow a connection, for example, at certain select times such as during a read cycle and not at all during a write cycle.

The use of the sense amplifier circuits described herein with SRAM is for illustrative purposes. The sense amplifier circuits described herein may be implemented with different types of memory devices and are not limited to use with SRAM. The sense amplifier circuits may also be used to sense other circuits.

This written description uses examples to disclose the patentable scope of the described subject matter, including the best mode, and also to enable a person of ordinary skill in the art to make and use the patentable scope of the described subject matter. The patentable scope includes other examples.

One of ordinary skill in the art will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments.

What is claimed is:

1. A sense amplifier circuit comprising:
a pair of cross-coupled inverters comprising a first inverter and a second inverter, the first inverter having a first pull-up transistor with a first pull-up terminal and a second pull-up terminal, the second pull-up terminal of the first pull-up transistor connected to a first sense amp node, the second inverter having a second pull-up transistor with a first pull-up terminal and a second pull-up terminal, the second pull-up terminal of the second pull-up transistor connected to a second sense amp node, the output of the first inverter coupled to the input of the second inverter at the first sense amp node, the output of the second inverter coupled to the input of the first inverter at the second sense amp node; and
a data line charging circuit having a first node connected to a data line and the first pull-up terminal of the first pull-up transistor, the data line charging circuit also having a second node connected to a complementary data line and the first pull-up terminal of the second pull-up transistor.

2. The sense amplifier circuit of claim 1, wherein the data line charging circuit comprises a pair of cross-coupled transistors, each with a drain terminal coupled to one of the data line and the complementary data line and a gate terminal coupled to the other of the data line and the complementary data line.

3. The sense amplifier circuit of claim 1, further comprising a first pass gate and a second pass gate, the first pass gate when enabled coupling the data line to the first sense amp node, the second pass gate when enabled coupling the complementary data line to the second sense amp node.

4. The sense amplifier circuit of claim 1, further comprising a sense amplifier enable circuit comprising a pull-down transistor coupled to a pull-down terminal of each of the first inverter and the second inverter.

5. The sense amplifier circuit of claim 1, further comprising a pre-charge circuit configured to charge each of the first sense amp node and the second sense amp node to a supply voltage level.

6. The sense amplifier circuit of claim 5, wherein the pre-charge circuit comprises a first pull-up transistor having a pull-up terminal coupled to the first sense amp node and a second pull-up transistor having a pull-up terminal coupled to the second sense amp node.

7. The sense amplifier circuit of claim 1, wherein:
the first inverter comprises a first PMOS transistor having a first terminal connected to a first terminal of a first NMOS transistor at the first sense amp node, the first PMOS transistor also having a gate terminal connected to a gate terminal of the first NMOS transistor; and
the second inverter comprises a second PMOS transistor having a first terminal connected to a first terminal of a second NMOS transistor at the second sense amp node, the second PMOS transistor also having a gate terminal connected to a gate terminal of the second NMOS transistor, the gates of the first NMOS and PMOS transistors coupled to the second sense amp node and the gates of the second NMOS and PMOS transistors coupled to the first sense amp node.

8. A sense amplifier circuit comprising:
a first PMOS transistor having a first terminal connected to a first terminal of a first NMOS transistor at a first sense amp node, the first PMOS transistor also having a gate terminal connected to a gate terminal of the first NMOS transistor;
a second PMOS transistor having a first terminal connected to a first terminal of a second NMOS transistor at a second sense amp node, the second PMOS transistor also having a gate terminal connected to a gate terminal of the second NMOS transistor, the gates of the first NMOS and PMOS transistors coupled to the second sense amp node and the gates of the second NMOS and PMOS transistors coupled to the first sense amp node; and
a data line charging circuit having a first node connected to a data line and a second terminal of the first PMOS transistor, the data line charging circuit also having a second node connected to a complementary data line and a second terminal of the second PMOS transistor.

9. The sense amplifier circuit of claim 8, wherein the data line charging circuit comprises a pair of cross-coupled transistors, each with a drain terminal coupled to one of the data line and the complementary data line and a gate terminal coupled to the other of the data line and the complementary data line.

10. The sense amplifier circuit of claim 8, further comprising a first pass gate and a second pass gate, the first pass gate when enabled coupling the data line to the first sense amp node, the second pass gate when enabled coupling the complementary data line to the second sense amp node.

11. The sense amplifier circuit of claim 8, further comprising a sense amplifier enable circuit comprising a pull-down transistor coupled to a second terminal of each of the first and second NMOS transistors.

12. The sense amplifier circuit of claim 8, further comprising a pre-charge circuit configured to charge each of the first sense amp node and the second sense amp node to a supply voltage level.

13. The sense amplifier circuit of claim 12, wherein the pre-charge circuit comprises a first pull-up transistor having a pull-up terminal coupled to the first sense amp node and a second pull-up transistor having a pull-up terminal coupled to the second sense amp node.

14. A method for sensing a value placed on a data line pair having a data line and a data line complement, the method comprising:
in a pair of cross-coupled inverters comprising a first inverter and a second inverter:
sensing using a first pull-up terminal of a first pull-up transistor of the first inverter of the pair of cross-coupled inverters the voltage level on the data line;
sensing using a first pull-up terminal of a second pull-up transistor of the second inverter of the pair of cross-coupled inverters the voltage level on the data line complement;
setting a second pull-up terminal of the first pull-up transistor of the first inverter to a zero voltage level when the voltage level on the data line of the data line pair indicates a first logical value; and
setting a second pull-up terminal of the second pull-up transistor of the second inverter to a zero voltage level when the voltage level on the data line complement of the data line pair indicates the first logical value.

15. The method of claim 14, further comprising:
charging the data line to a supply voltage level when the voltage level on the data line indicates a second logical value; and
charging the data line complement to a supply voltage level when the voltage level on the data line complement indicates the second logical value.

16. The method of claim 14, further comprising:
charging the data line to a supply voltage level using a first node of a data line charging circuit when the voltage level on the data line indicates a second logical value; and
charging the data line complement to a supply voltage level using a second node of the data line charging circuit when the voltage level on the data line complement indicates the second logical value.

17. The method of claim 16, wherein the data line charging circuit comprises a pair of cross-coupled transistors, each with a drain terminal coupled to one of the data line and the data line complement and a gate terminal coupled to the other of the data line and the data line complement.

* * * * *